(12) United States Patent
Fujikura

(10) Patent No.: US 9,175,417 B2
(45) Date of Patent: Nov. 3, 2015

(54) METHOD FOR MANUFACTURING A NITRIDE SEMICONDUCTOR SUBSTRATE

(75) Inventor: Hajime Fujikura, Tokyo (JP)

(73) Assignee: SCIOCS COMPANY LIMITED, Ibaraki-Ken (JP)

( * ) Notice: Subject to any disclaimer, the term of this patent is extended or adjusted under 35 U.S.C. 154(b) by 0 days.

(21) Appl. No.: 13/598,175

(22) Filed: Aug. 29, 2012

(65) Prior Publication Data

US 2013/0072005 A1     Mar. 21, 2013

(30) Foreign Application Priority Data

Sep. 15, 2011    (JP) ................................ 2011-201491

(51) Int. Cl.
| | |
|---|---|
| C30B 25/02 | (2006.01) |
| C30B 25/00 | (2006.01) |
| C30B 29/40 | (2006.01) |
| C30B 33/00 | (2006.01) |

(52) U.S. Cl.
CPC ............... *C30B 25/00* (2013.01); *C30B 29/406* (2013.01); *C30B 33/00* (2013.01)

(58) Field of Classification Search
CPC ...................... H01L 21/0204; H01L 21/02005; H01L 21/02008; H01L 21/0262; H01L 21/0242; H01L 21/02293; H01L 21/2022; C30B 25/00; C30B 33/00; C30B 29/406; C30B 25/02; C23C 16/4488
USPC .......... 438/507, 269, 724, 744; 257/E21.237, 257/E21.484, E21.293, E33.025, E33.03, 257/E21.097; 117/2–3, 107; 451/41
See application file for complete search history.

(56) References Cited

U.S. PATENT DOCUMENTS

| | | | |
|---|---|---|---|
| 6,652,648 B2 * | 11/2003 | Park | ................................ 117/90 |
| 7,223,155 B2 | 5/2007 | Matsumoto | |
| 7,464,702 B2 | 12/2008 | Matsumoto | |
| 7,591,712 B2 | 9/2009 | Morikawa et al. | |

(Continued)

FOREIGN PATENT DOCUMENTS

| | | | | |
|---|---|---|---|---|
| EP | 2116636 A2 * | 11/2009 | .............. | C30B 29/40 |
| JP | 1122999 A | 5/1989 | | |

(Continued)

OTHER PUBLICATIONS

Japanese Office Action dated Sep. 2, 2014 for Patent application No. 2011-201491.

(Continued)

*Primary Examiner* — Jarrett Stark
*Assistant Examiner* — Bitew Dinke
(74) *Attorney, Agent, or Firm* — Fleit Gibbons Gutman Bongini & Bianco PL; Martin Fleit; Paul D. Bianco

(57) ABSTRACT

The invention provides a method for manufacturing a nitride semiconductor substrate capable of reducing a cleavage during slicing of the nitride semiconductor single crystal and capable of improving a yield rate of the nitride semiconductor substrate. The method includes growing a nitride semiconductor single crystal on a seed crystal substrate by vapor phase epitaxy; grinding an outer peripheral surface the grown nitride semiconductor single crystal; and slicing the nitride semiconductor single crystal with its outer peripheral surface ground. A grinding amount of the outer peripheral surface of the nitride semiconductor single crystal in the step of grinding is 1.5 mm or more.

19 Claims, 3 Drawing Sheets

(56) References Cited

U.S. PATENT DOCUMENTS

| | | | |
|---|---|---|---|
| 2002/0036182 A1 | 3/2002 | Kajimoto et al. | |
| 2005/0073027 A1* | 4/2005 | Irikura et al. | 257/615 |
| 2006/0011135 A1* | 1/2006 | Dmitriev et al. | 118/718 |
| 2006/0249135 A1 | 11/2006 | Matsumoto | |
| 2007/0105485 A1 | 5/2007 | Matsumoto | |
| 2008/0029783 A1* | 2/2008 | Ueno | 257/190 |
| 2008/0176386 A1* | 7/2008 | Nakayama | 438/507 |
| 2008/0223351 A1 | 9/2008 | Morikawa et al. | |
| 2008/0277667 A1 | 11/2008 | Matsumoto | |
| 2008/0296585 A1* | 12/2008 | Matsumoto et al. | 257/76 |
| 2009/0056618 A1* | 3/2009 | Yoshida | 117/84 |
| 2009/0081857 A1* | 3/2009 | Hanser et al. | 438/507 |
| 2009/0127664 A1* | 5/2009 | Okahisa et al. | 257/615 |
| 2009/0250790 A1* | 10/2009 | Nakayama et al. | 257/615 |
| 2010/0001376 A1* | 1/2010 | Takamizawa et al. | 257/615 |
| 2010/0028605 A1 | 2/2010 | Oshima | |
| 2010/0102330 A1* | 4/2010 | Motoki et al. | 257/76 |
| 2010/0133657 A1* | 6/2010 | Oshima | 257/615 |
| 2010/0213576 A1* | 8/2010 | Hiranaka et al. | 257/615 |
| 2010/0233870 A1* | 9/2010 | Oshima | 438/478 |
| 2010/0322841 A1* | 12/2010 | Okahisa et al. | 423/409 |
| 2011/0006397 A1* | 1/2011 | Fujikura et al. | 257/615 |
| 2011/0068434 A1* | 3/2011 | Yamaguchi et al. | 257/615 |
| 2011/0092052 A1* | 4/2011 | Ueno | 438/460 |
| 2011/0163326 A1* | 7/2011 | Matsumoto | 257/76 |
| 2011/0217505 A1* | 9/2011 | Callahan | 428/80 |
| 2011/0256693 A1* | 10/2011 | D'Evelyn et al. | 438/478 |
| 2012/0043645 A1* | 2/2012 | Ishibashi et al. | 257/615 |
| 2012/0112320 A1* | 5/2012 | Kubo et al. | 257/615 |
| 2012/0184108 A1* | 7/2012 | Ishibashi et al. | 438/706 |
| 2013/0061841 A1* | 3/2013 | Matsumoto et al. | 125/21 |

FOREIGN PATENT DOCUMENTS

| | | |
|---|---|---|
| JP | 20046997 | 1/2004 |
| JP | 2005200250 | 7/2005 |
| JP | 2006-190909 A | 7/2006 |
| JP | 201040696 | 2/2010 |
| WO | 2006120736 | 11/2006 |

OTHER PUBLICATIONS

English translation of Japanese Office Action dated Sep. 12, 2014 for patent application No. 2011-201491.

* cited by examiner

METHOD FOR MANUFACTURING A NITRIDE SEMICONDUCTOR SUBSTRATE

BACKGROUND

The present application is based on Japanese Patent Applications No. 2011-201491 filed on Sep. 15, 2011, the entire contents of which are hereby incorporated by reference.

1. Technical Field

The present invention relates to a method for manufacturing a nitride semiconductor substrate for manufacturing a plurality of nitride semiconductor substrates from a nitride semiconductor single crystal.

2. Description of Related Art

In order to fabricate a compound semiconductor substrate, there is a method of growing a compound semiconductor crystal (ingot) by a liquid-phase growth or a vapor-phase growth, then slicing an obtained ingot, to thereby fabricate a substrate (wafer).

In a fabrication technique of the compound semiconductor substrate, for example, outer cylindrical grinding for grinding an outer periphery of the ingot is carried out, to remove impurities, etc., that exist on a skin of GaAs single crystal ingot before a wafer is fabricated by slicing the ingot of the GaAs single crystal which is crystal-grown by LEC method (a liquid encapsulating Czochralski method) (for example, see patent document 1).

Further, there is also proposed a method of making a running direction of a wire row inclined to {1-100} plane (M plane) being a cleavage plane which is most easily cleaved, for reducing the generation of a crack when the GaN ingot obtained by vapor phase epitaxy is ground (sliced) using the wire row (for example, see patent document 2).

Patent Document 1

Japanese Patent Laid Open Publication No. 1989-122999

Patent Document 2

Japanese Patent Laid Open Publication No. 2006-190909

Incidentally, vapor phase epitaxy includes Hydride Vapor Phase Epitaxy (HYPE method) and Metal Organic Vapor Phase Epitaxy (MOVPE method), which are used for a growth of the nitride semiconductor single crystal such as GaN. However, when the crystal-grown GaN single crystal (ingot) is ground using a wire saw, cleavage is generated, resulting in a poor yield rate. Particularly, when the GaN single crystal has a large diameter and when the GaN crystal is thick, the cleavage is easily generated and reduction of the yield rate is great.

SUMMARY OF THE INVENTION

An object of the present invention is to provide a method for manufacturing a nitride semiconductor substrate capable of reducing a cleavage when slicing a nitride semiconductor single crystal and improving a yield rate of the nitride semiconductor substrate.

According to a first aspect of the present invention, there is provided a method for manufacturing a nitride semiconductor substrate, comprising:

growing a nitride semiconductor single crystal on a seed crystal substrate by vapor phase epitaxy;

grinding an outer peripheral surface of the grown nitride semiconductor single crystal; and slicing the nitride semiconductor single crystal with its outer peripheral surface ground, wherein a grinding amount of the outer peripheral surface of the nitride semiconductor single crystal in grinding is 1.5 mm or more.

DESCRIPTION OF PREFERRED EMBODIMENT OF THE INVENTION

Preferred embodiment of a method for manufacturing a nitride semiconductor substrate according to the present invention will be described hereafter.

Figure 1:
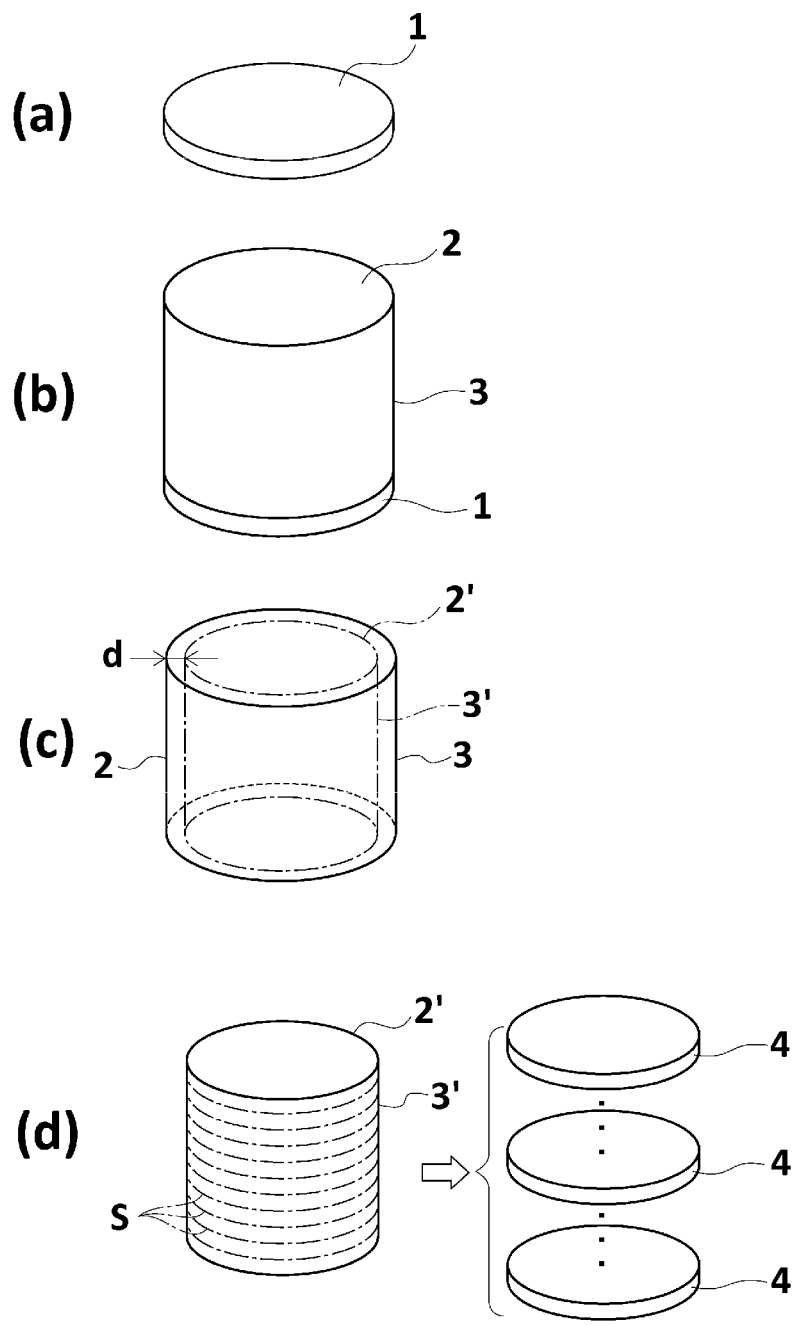
FIGS. 1(a)-(d) are a step view of a method for manufacturing a nitride semiconductor substrate according to an embodiment of the present invention.

FIG. 1 is a step view of the method for manufacturing a nitride semiconductor substrate according to an embodiment of the present invention. In this embodiment, GaN is taken as an example of a nitride semiconductor for explanation.

First, a seed crystal substrate is prepared, for growing a GaN single crystal, being a nitride semiconductor single crystal. A disc-shaped GaN substrate (GaN freestanding substrate) 1 is used as the seed crystal substrate (FIG. 1(a)). A main surface of the disc-shaped GaN substrate 1 is taken as a C-plane, which is formed by a VAS method (a Void-Assisted Separation method) for example, or the GaN substrate manufactured by the method for manufacturing a nitride semiconductor substrate of the present invention may be used as the seed crystal substrate. The GaN substrate 1, being the seed crystal substrate, may have the main surface (growth surface) not as the C-plane, but as A-plane, M-plane, R-plane or a plane inclined in a prescribed direction from these planes.

Next, a GaN single crystal (GaN ingot) 2 is grown on the GaN substrate 1 being the seed crystal substrate by vapor phase epitaxy, as the nitride semiconductor single crystal (FIG. 1(b)). HVPE method suitable for high speed growth is used as the vapor phase epitaxy, so that the GaN single crystal 2 is crystal-grown by supplying source gas onto a heated GaN substrate 1 while rotating the disc-shaped GaN substrate 1 around its central axis. Gallium chloride (GaCl) and ammonia ($NH_3$) are used as the source gas. In this embodiment, a growth condition by the HVPE method is adjusted, and a cylindrical GaN single crystal 2 having approximately the same diameter as the diameter of the GaN substrate 1, is formed on the disc-shaped GaN substrate 1.

Not only the HVPE, but also the MOVPE or a combination of the MOVPE and HVPE may be used as the vapor phase epitaxy of the GaN single crystal 2. Further, although the GaN single crystal 2 may have preferably a cylindrical shape, it may also have a circular truncated cone in which the diameter of the GaN single crystal is gradually decreased toward a growth direction vertical to the main surface of the GaN substrate 1, or a reversed circular truncated cone in which the diameter of the GaN single crystal is reversely increased toward the growth direction. The GaN single crystal having the reversed circular truncated cone can be obtained by its N-plane growth on the main surface of an N-polar face of the GaN substrate 1 for example.

Next, grinding is applied to an outer peripheral surface (side face) 3 of the crystal-grown cylindrical GaN single crystal 2 (FIG. 1(C)). The grinding of the outer peripheral surface 3 of the GaN single crystal 2 is performed using an outer peripheral grinding attachment (cylindrical grinding attachment) for example, which is provided with a grindstone (grinding wheel). Grinding amount d of the outer peripheral surface 3 of the GaN single crystal 2 to be ground, is set to 1.5 mm or more for reducing a slice-cleavage at the time of slicing performed afterward, and surface roughness (root-mean-square roughness) RMS of the outer peripheral surface 3' after grinding is preferably set to 3 μm or less. GaN single crystal 2' with its outer periphery ground, has further an orientation flat or a notch formed therein.

Note that FIG. 1(c) shows a simple GaN single crystal as the GaN single crystal 2 being an object to be ground. However, it is also acceptable that a plurality of (or a plurality of sheets of) GaN single crystals are stuck to each other by an adhesive agent, etc., to obtain a lamination body (composite body), and grinding is applied to the outer peripheral surface of the GaN single crystals having such a lamination body structure.

Figure 4:
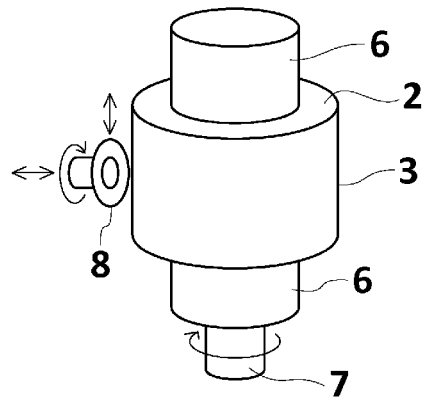
FIG. 4 is a schematic view showing an example of an outer peripheral grinding treatment applied to the GaN single crystal.

FIG. 4 shows an example of an outer peripheral grinding treatment for grinding the outer peripheral surface 3 of the GaN single crystal 2. Both end faces of the cylindrical GaN single crystal 2 is held by clamps from upper and lower sides. A rotary shaft 7 is connected to a lower side clamps 6, so that the cylindrical GaN single crystal 2 is driven to rotate around its central axis together with the clamps 6 from upper and lower sides. A grinding wheel 8 is rotatably provided to outside of the GaN single crystal 2, so that the outer peripheral surface of the GaN single crystal 2 is ground. The grinding wheel 8 is moved vertically to the outer peripheral surface 3 of the GaN single crystal 2 (in an axial direction of the GaN single crystal 2) and horizontally (in a radial direction of the GaN single crystal 2), so that the outer peripheral surface 3 of the rotated GaN single crystal 2 is uniformly and smoothly ground with a prescribed grinding amount.

Note that for example a rough grinding wheel for rough grinding and a precise grinding wheel for precise grinding are prepared as the grinding wheel 8, and the rough grinding wheel is used in the beginning of the grinding, and the precise grinding wheel is used for final grinding, to thereby finish the surface roughness RMS of the outer peripheral surface of the GaN single crystal 2' after grinding so as to set to 3 μm or less. Further, in the grinding treatment of FIG. 4, grinding is applied to the outer periphery of the GaN single crystal, with its central axis placed and supported in a vertical direction. However, the grinding may also be applied to the outer periphery of the GaN single crystal 2, with its central axis placed and supported in a horizontal direction.

Subsequently, the cylindrical GaN single crystal 2' with its outer peripheral surface 3 subjected to grinding, is sliced vertically at a slice position S in an axial direction being a crystal growth direction of the cylindrical GaN single crystal 2', and at equal intervals along the axial direction, to thereby form a plurality of disc-shaped thin GaN substrates 4 being nitride semiconductor substrates (FIG. 1(d)). Further, when an angle formed by a plane to be sliced and a central axis of the crystal is shifted from 90°, the GaN substrate with a substrate plane having a desired slightly inclined angle (off-angle) with respect to the substrate plane (C-plane, etc.) of the GaN substrate 4 which is sliced vertically to the central axis of the GaN single crystal 2', can also be obtained.

Slice of the GaN single substrate 2' is carried out while charging free abrasive grains (abrasive solution) to a wire running along a slice position "s" of the GaN single crystal 2' using a wire saw for example. The thickness of the sliced GaN substrate 4 is in a range of about 500 μm to 1 mm. The sliced GaN substrate 4 is subjected to a process of outer shape processing, chamfering, polishing, and cleaning, etc., to become the GaN substrate (wafer) for a semiconductor device. For example, the GaN single crystal 2' is sliced to a thickness of 600 μm, and both surfaces are subjected to mirror polishing, to thereby obtain the GaN substrate with a thickness of 400 μm.

Note that in FIG. 1(d), the GaN single crystal 2' being an object to be sliced, is a simple GaN single crystal. However, it is also acceptable that a plurality of (or a plurality of sheets of) GaN single crystals are stuck to each other by an adhesive agent, etc., to obtain a lamination body (composite body). Further, an inner peripheral cutting edge and an outer peripheral cutting edge, etc., may be used in slicing.

As described above, when the outer peripheral surface 3 of the GaN single crystal 2 is ground with a grinding amount of 1.5 mm or more and thereafter the ground GaN single crystal 2 is sliced, the generation of the slice-cleavage can be reduced. This case will be described next.

When the GaN single crystal 2 in a state of being grown, is sliced without grinding the outer peripheral surface 3 of the grown GaN single crystal (GaN ingot) 2, the cleavage is easily generated. Particularly, when the diameter φ of the GaN single crystal is large (φ≥36 mm) and the thickness L of the GaN single crystal is large (L≥3 mm), the slice-cleavage is easily generated, and reduction of the yield rate during slicing (slice yield) is large. As a result of examining the reduction of the slice yield, the GaN single crystal 2 immediately after growth involves a great strain in its outer peripheral part, and it is found that such a strain is a cause of the slice-cleavage.

As described in the description of the related art, in a case of GaAs and Si, grinding of the outer periphery is carried out before the grown ingot is sliced. However, in a case of GaAs and Si, the reduction of the slice yield does not occur even if the outer peripheral grinding is not performed like a case of GaN. Probably this is because in a semiconductor such as GaAs and Si, relative large degree of freedom is given to a movement of a dislocation in the crystal, and therefore even if the strain is involved in the outer peripheral part of the ingot, such a strain is relaxed by the movement of the dislocation during growth or cooling. Further, the ingot of the semiconductor of GaAs and Si is generally liquid-phase grown, which is carried out while increasing its diameter to 4 to 12 inches during growth, with crystal of several cm diameter as a seed crystal. The growth is carried out while controlling the diameter of the ingot to a diameter close to that of the final product. However, generally, the obtained ingot has a shape in which a crystal diameter is increased or decreased in a growth direction. Therefore, the ingot is fabricated with a diameter larger to a some degree than that of the final product (typically, 1 cm or more larger than that of the final product), and this diameter is adjusted to a diameter of the product by outer periphery grinding. This technique is used in the ingot growth of the semiconductors. Further, since grinding of these semiconductors is easy, remarkable increase of a manufacturing cost is not invited even if such a method is employed.

Meanwhile, regarding the nitride semiconductor represented by GaN, the situation is different from the ingot of the aforementioned GaAs and Si. Therefore, the technique of applying outer peripheral grinding before slicing the ingot, is not used. First of all, the aforementioned increase or decrease of the diameter is not observed in the vapor phase growth (HVPE method and MOVPE method) generally used for the nitride semiconductor. In addition, the nitride semiconductor is made of a material difficult to be cut. Therefore, when the outer periphery of the ingot of the nitride semiconductor is ground by mm unit, significant increase of the manufacturing cost is invited thereby. Therefore, it is a technical common sense and a conventional manufacturing method that the ingot having a diameter extremely close to that of the final product is grown in the ingot growth of the nitride semiconductor, and the grinding amount of the outer periphery grinding is suppressed to minimum (typically, the grinding amount of the outer periphery is suppressed to 0.5 mm or less, and ideally to 0). However, the movement of the dislocation in the crystal is not easy in the nitride semiconductor unlike the semiconductor such as GaAs, and therefore relax of the strain that exists in the outer peripheral part of the ingot is not generated by the movement of the dislocation. Therefore, as described in this specification, it is difficult to obtain a high slice yield in the conventional manufacturing method wherein the amount of the outer peripheral grinding is suppressed to minimum. Meanwhile, according to the method of the present invention wherein the nitride semiconductor crystal (ingot) is sliced after grinding the outer peripheral surface by 1.5 mm or more, the slice yield can be dramatically improved, and as a result, the manufacturing cost can be suppressed.

In the growth of the GaN single crystal 2, an environment and a growth condition are largely different between an area of the outer peripheral part of the growth surface, and an area inside of the outer peripheral part (central part side). Namely, regarding the crystal at an arbitrary certain point within an area at a central part side, the vicinity of a circumference of this crystal is in a state of being entirely surrounded by other crystals. Meanwhile, there is a space surrounding the GaN single crystal 2 outside of the vicinity of the outer peripheral part of the GaN single crystal 2 where the crystal does not exist, and the crystal in the area of the outer peripheral part is in a state that the crystal is disconnected at the outside. Therefore, in the central part side area, a constant suitable growth condition (such as growth temperature) can be maintained. In the area of the outer peripheral part, heat radiation to outside is larger than that of the central part side, thus easily decreasing or fluctuating the growth temperature, and disturbance is easily generated in a flow of a source gas, thus making it difficult to maintain the constant suitable growth condition.

Due to such a difference in the growth condition, the produced crystal is different between the outer peripheral part and the central part side. More specifically, the crystal of the outer peripheral part has a high impurity concentration compared with the central part side crystal, and there is a large density of vacancies formed after leak of Ga (gallium) and N (nitrogen) from the GaN single crystal, or a large density of point defects such as anti-sites formed by entering of Ga into a site into which N is expected to enter. Such a difference in impurity concentration and point defect density appears as a difference of mechanical property such as hardness of the crystal, lattice constant and compactness of the crystal, thereby generating the strain (stress) between the crystal of the outer peripheral part and the crystal of the central part side. The strain (stress) is locally released when slicing is performed, thus causing the cleavage of the crystal.

Therefore, the cleavage at the time of slicing can be prevented by grinding and removing the outer peripheral part having the strain which is the cause of the slice-cleavage. The thickness of the area of the outer peripheral part where the strain being the slice-cleavage is generated, is about 1.5 mm from the outer peripheral surface 3. Therefore, when the amount of grinding the outer peripheral surface exceeds 1.5 mm, the slice yield is suddenly increased.

Figure 2:
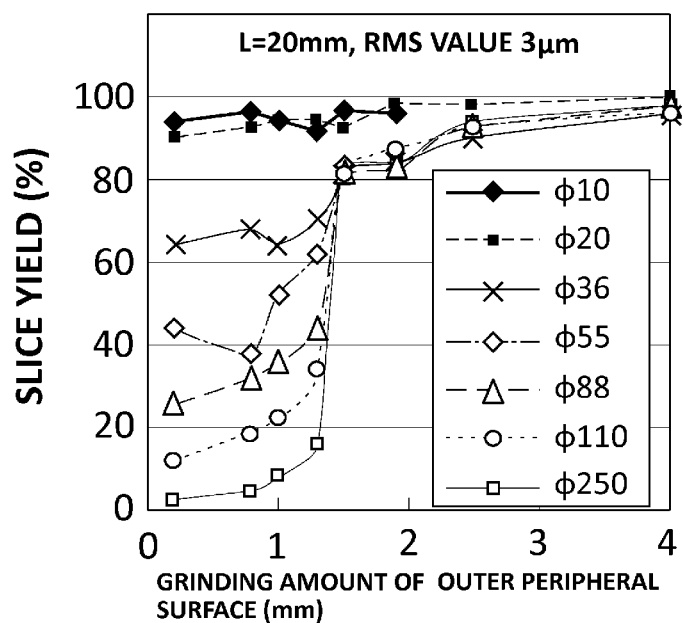
FIG. 2 is a graph showing a relation between an outer peripheral grinding amount of the GaN single crystal and a slice yield of the GaN single crystal.

As a specific example, the outer peripheral surface 3 of the GaN single crystal with diameter φ of 10 mm to 250 mm and thickness L of 20 mm is subjected to grinding with grinding amount d variously changed to 4 mm, then the GaN single crystal 2' that has undergone grinding treatment (RMS value of the outer peripheral surface 3' is 3 μm) is sliced by a wire saw, to thereby fabricate a GaN substrate 4 with a thickness of 600 μm. FIG. 2 shows a relation between the grinding amount of the outer peripheral surface 3 of the GaN single crystal 2 and the slice yield of the ground GaN single crystal 2'.

As shown in FIG. 2, when the outer peripheral surface 3 of the GaN single crystal 2 with a diameter of 36 mm to 250 mm is ground with a grinding amount of 1.5 mm, the slice-cleavage is largely suppressed, and the slice yield is tremendously increased, which is larger than 80%. Further, in a case of the GaN single crystal 2 with a diameter of 36 mm to 250 mm, increase of the slice yield is remarkable as the diameter becomes larger. However, the ratio of the increase of the slice yield is slow even if further grinding is carried out, with the grinding amount exceeding 1.5 mm. Therefore, the grinding amount of 1.5 mm or slightly larger than 1.5 mm of the outer peripheral surface 3 of the GaN single crystal 2 is sufficiently effective for improvement of the slice yield.

Note that regarding the GaN single crystal 2 with a diameter of 10 mm to 20 mm, as shown in FIG. 2, the increase of the slice yield is slight even if the outer peripheral surface 3 is ground before slicing. Further, regarding the GaN single crystal with a thickness of less than 3 mm, similarly to a case of the GaN single crystal with a diameter of 10 mm to 20 mm, almost no increase of the slice yield is recognized even if the outer peripheral surface is ground. Thus, when the diameter of the GaN single crystal is small and when the thickness of the GaN single crystal is small, accumulation of the aforementioned strain is small. Therefore, the slice yield is almost unchanged even if the outer peripheral part of the GaN single crystal is ground or not ground, and the improvement of the slice yield by the outer peripheral grinding of the GaN single crystal can't be expected so much.

Figure 3:
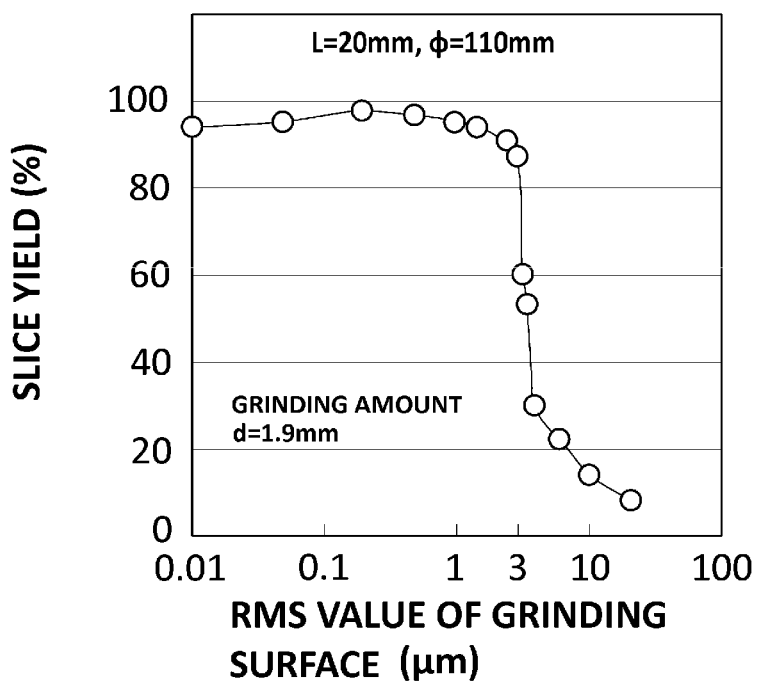
FIG. 3 is a graph showing a relation between RMS value of the outer peripheral grinding surface of the GaN single crystal and the slice yield of the GaN single crystal.

Further, the surface roughness RMS of the outer peripheral surface (grinding surface) 3' of the GaN single crystal 2' with its outer periphery ground, is preferably set to 3 μm or less. When the RMS of the ground outer peripheral surface 3' is larger than 3 μm, the slice yield is suddenly decreased. As a specific example, the outer peripheral surface 3 of the GaN single crystal 2 with diameter φ of 110 mm and thickness L of 20 mm is ground with grinding amount d set to 1.9 mm, and RMS value of the outer peripheral surface (grinding surface) 3' after grinding is variously changed. FIG. 3 shows a relation between the RMS value of the outer peripheral grinding surface of the GaN single crystal at this time, and the slice yield of the GaN single crystal.

As shown in FIG. 3, when the RMS value of the grinding surface exceeds 3 μm, 80% or more of the slice yield is suddenly decreased. Although depending on the diameter and the thickness of the GaN single crystal, this is because the cleavage is suddenly easily generated at the time of slicing due to roughness of the grinding surface, if the surface roughness RMS exceeds 3 μm or around.

The method for manufacturing the nitride semiconductor substrate according to another embodiment of the present invention will be described next, using a step view shown in FIGS. 5(a)-(c2). In this embodiment as well, explanation will be given, with GaN given as the nitride semiconductor for example.

In this embodiment, a regular hexagon-shaped plate-like GaN substrate (GaN freestanding substrate) 10 is used as a seed crystal substrate (FIG. 5(a)). The regular hexagon-shaped plate-like GaN substrate 10 is formed by cleaving six places of the outer peripheral surface (side face) of the disc-shaped C-plane GaN substrate, with M-plane ({10-10} plane) as a cleavage plane.

Next, the GaN substrate 10 being the seed crystal substrate is installed in an HVPE apparatus, and a GaN single crystal (GaN ingot) 20 is grown on the GaN substrate 10 (FIG. 5(b)).

Figure 5:
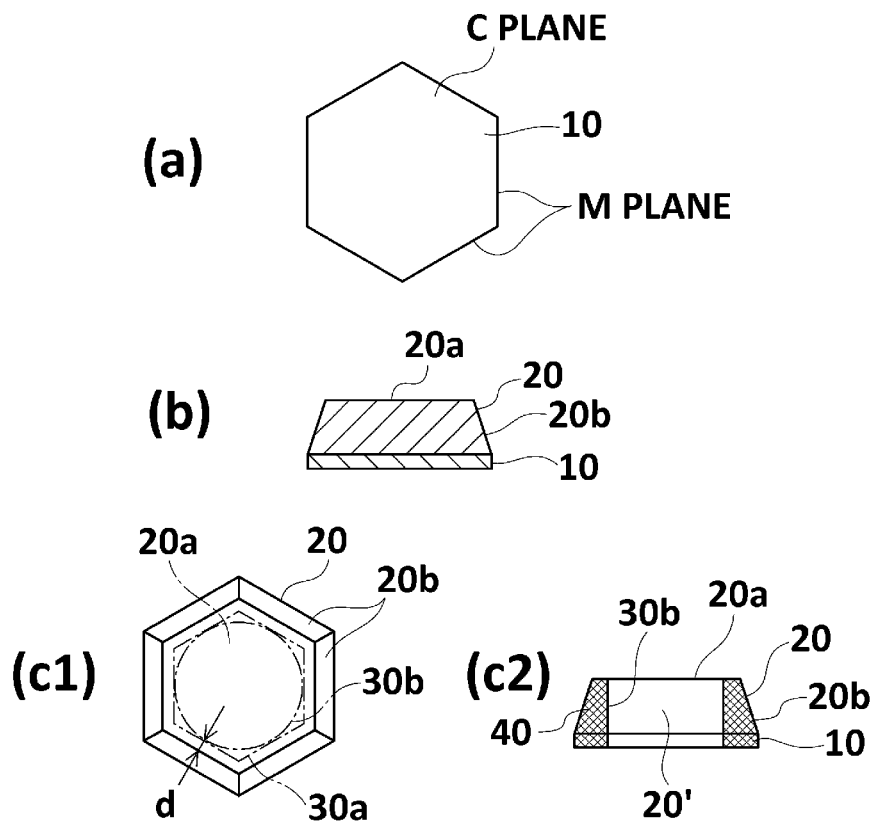
FIGS. 5(a)-(c2) are a step view of the method for manufacturing a nitride semiconductor substrate according to another embodiment of the present invention.

For example, as shown in FIG. 5(b) and FIG. 5(c1), the GaN single crystal 20 is formed into a hexagonal pyramid shape, with an upper surface 20a formed as C-plane, and six side faces 20b formed as {10-11} planes.

Next, the outer peripheral part of the hexagonal pyramid-shaped GaN single crystal is ground (FIG. 5(c1), (c2)). As shown in FIG. 5(c1), the outer peripheral grinding of the hexagonal pyramid-shaped GaN single crystal is performed in such a way that it is ground into a cylindrical shape with a circular contour line 30b as the outer periphery, which is the contour line 30b inscribed in the hexagonal shape 30a, wherein a similar hexagonal shape 30a positioned inside by distance d (d is 1.5 mm or more) from each side of a hexagon of an upper surface 20a is considered in a hexagonal upper surface 20a of the GaN single crystal 20. Namely, as shown in FIG. 5(c2), a reticulated shaded area of the outer peripheral part of the contour line 30b is a grinding area 40, and inside of the grinding area 40 is a cylindrical GaN single crystal 20' after grinding.

Similarly to the above-descried embodiment, the ground cylindrical GaN single crystal 20' is sliced into a plurality of thin disc-shaped GaN substrates using the wire saw. In this embodiment as well, similarly to the above-described embodiment, the cleavage at the time of slicing is reduced, and the slice yield is significantly improved.

Note that in this embodiment, the regular hexagonal plate-shaped GaN substrate 10 is cleaved and formed as the seed crystal substrate. However, the hexagonal pyramid-shaped, or hexagonal prism-shaped GaN single crystal (GaN ingot) may be grown on an opening part of the regular hexagon of the growth surface of the GaN substrate, by forming a mask having an opening so that each side of the regular hexagon is set in parallel to the M-plane.

Further, in any one of the aforementioned embodiments, the outer peripheral grinding is cylindrically applied to the nitride semiconductor single crystal (GaN crystal) which is vapor-phase grown on the seed crystal substrate (GaN substrate). However, the nitride semiconductor single crystal after grinding is not limited to a cylindrical shape. For example, when truncated cone-shaped, prism-shaped, and truncated pyramid-shaped nitride semiconductor single crystal is grown, the nitride semiconductor single crystal after outer peripheral grinding may be formed into a truncated cone-shape, a prism, and a truncated pyramid-shape in which the outer peripheral surface (side face) of the grown nitride semiconductor single crystal is uniformly ground and reduced. Namely, the strain which is a cause of the slice-cleavage that exists in the outer peripheral part of the grown nitride semiconductor single crystal can be removed.

Further, in any one of the aforementioned embodiments, GaN is given as an example of the nitride semiconductor for explanation. However, the present invention is not limited to the GaN substrate, and of course can be applied to the manufacture of the nitride semiconductor substrate made of AlN, InN, and AlGaN, etc.

What is claimed is:

1. A method for manufacturing a nitride semiconductor substrate, comprising:
   growing a nitride semiconductor single crystal on a seed crystal substrate made of a nitride semiconductor single crystal by vapor phase epitaxy;
   grinding a single crystal outer peripheral surface of the grown nitride semiconductor single crystal; and
   slicing the grown nitride semiconductor single crystal with its outer peripheral surface ground,
   wherein, after the grinding step, the single crystal outer peripheral surface has a surface roughness RMS of 3 μm or less and wherein a grinding amount of the single crystal outer peripheral surface of the grown nitride semiconductor single crystal is 1.5 mm or more to increase slice yield in the step of slicing.

2. The method for manufacturing a nitride semiconductor substrate according to claim 1, wherein the nitride semiconductor single crystal, grown in the step of growing, is formed into a cylindrical shape.

3. The method for manufacturing a nitride semiconductor substrate according to claim 2, wherein a diameter of the cylindrical nitride semiconductor single crystal is 36 mm or more.

4. The method for manufacturing a nitride semiconductor substrate according to claim 1, wherein a thickness of the nitride semiconductor single crystal is 3 mm or more.

5. A method for manufacturing a nitride semiconductor substrate, comprising:
   growing a nitride semiconductor single crystal on a seed crystal substrate by vapor phase epitaxy;
   grinding a single crystal outer peripheral surface of the grown nitride semiconductor single crystal; and
   slicing the nitride semiconductor single crystal with its outer peripheral surface ground, wherein a grinding amount of the single crystal outer peripheral surface of the grown nitride semiconductor single crystal is 1.5 mm or more, and
   wherein, after the grinding step, the single crystal outer peripheral surface has a surface roughness RMS of 3 μm or less.

6. The method for manufacturing a nitride semiconductor substrate according to claim 5, wherein the nitride semiconductor single crystal is formed into a cylindrical shape.

7. The method for manufacturing a nitride semiconductor substrate according to claim 6, wherein a diameter of the cylindrical nitride semiconductor single crystal is 36 mm or more.

8. The method for manufacturing a nitride semiconductor substrate according to claim 5, wherein a thickness of the nitride semiconductor single crystal is 3 mm or more.

9. The method for manufacturing a nitride semiconductor substrate according to claim 1, wherein the nitride semiconductor single crystal, after grinding, is formed into a shape selected from the group consisting of a cylindrical shape, a truncated cone shape, a prism shape, and a truncated pyramid shape.

10. The method for manufacturing a nitride semiconductor substrate according to claim 5, wherein the nitride semiconductor single crystal, after grinding, is formed into a shape selected from the group consisting of a cylindrical shape, a truncated cone shape, a prism shape, and a truncated pyramid shape.

11. A method for manufacturing a nitride semiconductor substrate, comprising:
   growing a nitride semiconductor single crystal on a seed crystal substrate by vapor phase epitaxy; the nitride semiconductor single crystal grown formed into a cylindrical shape and having a diameter of 36 mm or more;
   grinding a single crystal outer peripheral surface of the grown nitride semiconductor single crystal, wherein an entirety of the outer peripheral surface is ground; and
   slicing the nitride semiconductor single crystal with its outer peripheral surface ground, wherein a grinding amount of the single crystal outer peripheral surface of the grown nitride semiconductor single crystal is 1.5 mm or more, and
   wherein, after the grinding step, the single crystal outer peripheral surface has a surface roughness RMS of 3 μm or less.

12. The method for manufacturing a nitride semiconductor substrate according to claim 11, wherein a thickness of the nitride semiconductor single crystal is 3 mm or more.

13. The method for manufacturing a nitride semiconductor substrate according to claim 1, wherein an entirety of the outer peripheral surface of the grown nitride semiconductor single crystal is ground.

14. The method for manufacturing a nitride semiconductor substrate according to claim 5, wherein an entirety of the outer peripheral surface of the grown nitride semiconductor single crystal is ground.

15. The method for manufacturing a nitride semiconductor substrate according to claim 1, wherein the grinding in the step of grinding is to a depth of 1.5 mm or more into the grown nitride semiconductor single crystal.

16. The method for manufacturing a nitride semiconductor substrate according to claim 5, wherein the grinding in the step of grinding is to a depth of 1.5 mm or more into the grown nitride semiconductor single crystal.

17. The method for manufacturing a nitride semiconductor substrate according to claim 11, wherein the grinding in the step of grinding is to a depth of 1.5 mm or more into the grown nitride semiconductor single crystal.

18. The method for manufacturing a nitride semiconductor substrate according to claim 1, wherein the nitride semiconductor single crystal, grown in the step of growing, is grown on an N-polar face of the seed crystal substrate and is formed into a reversed, circular truncated cone shape wherein a diameter of the nitride semiconductor single crystal is increased in a growth direction.

19. The method for manufacturing a nitride semiconductor substrate according to claim 5, wherein the nitride semiconductor single crystal, grown in the step of growing, is grown on an N-polar face of the seed crystal substrate and is formed into a reversed, circular truncated cone shape wherein a diameter of the nitride semiconductor single crystal is increased in a growth direction.

* * * * *